United States Patent
Li et al.

(10) Patent No.: US 11,533,056 B2
(45) Date of Patent: Dec. 20, 2022

(54) CIRCUIT, CHIP AND SEMICONDUCTOR DEVICE

(71) Applicant: TAIWAN SEMICONDUCTOR MANUFACTURING COMPANY LTD., Hsinchu (TW)

(72) Inventors: Chao Chieh Li, Hsinchu (TW);
Chia-Chun Liao, Taipei (TW);
Min-Shueh Yuan, Taipei (TW);
Chih-Hsien Chang, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 662 days.

(21) Appl. No.: 16/573,853

(22) Filed: Sep. 17, 2019

(65) Prior Publication Data

US 2021/0080503 A1    Mar. 18, 2021

(51) Int. Cl.
*H03L 7/08*    (2006.01)
*G01R 31/317*  (2006.01)
*G04F 10/00*   (2006.01)
*H03L 7/00*    (2006.01)

(52) U.S. Cl.
CPC .......... *H03L 7/08* (2013.01); *G01R 31/31707* (2013.01); *G01R 31/31711* (2013.01); *G04F 10/005* (2013.01); *H03L 7/00* (2013.01)

(58) Field of Classification Search
CPC ....... H03L 7/08; H03L 7/00; G01R 31/31707; G01R 31/31711; G04F 10/005
USPC .............. 331/1 A, 16, 34, 18; 327/156, 159; 375/376
See application file for complete search history.

(56) References Cited

U.S. PATENT DOCUMENTS 11,095,295 B2 *    8/2021    Monk ................... G04F 10/005

\* cited by examiner

*Primary Examiner* — Arnold M Kinkead
(74) *Attorney, Agent, or Firm* — WPAT; Anthony King (57) ABSTRACT

A circuit is disclosed. The circuit includes a time-to-digital converter (TDC), and an evaluation circuit coupled to the TDC and a phase-locked loop (PLL) external to the circuit.

20 Claims, 10 Drawing Sheets

CIRCUIT, CHIP AND SEMICONDUCTOR DEVICE

BACKGROUND

A phase locked loop (PLL) may refer to an electrical circuit which can output a signal having a frequency that is a multiple of the frequency of the input signal.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
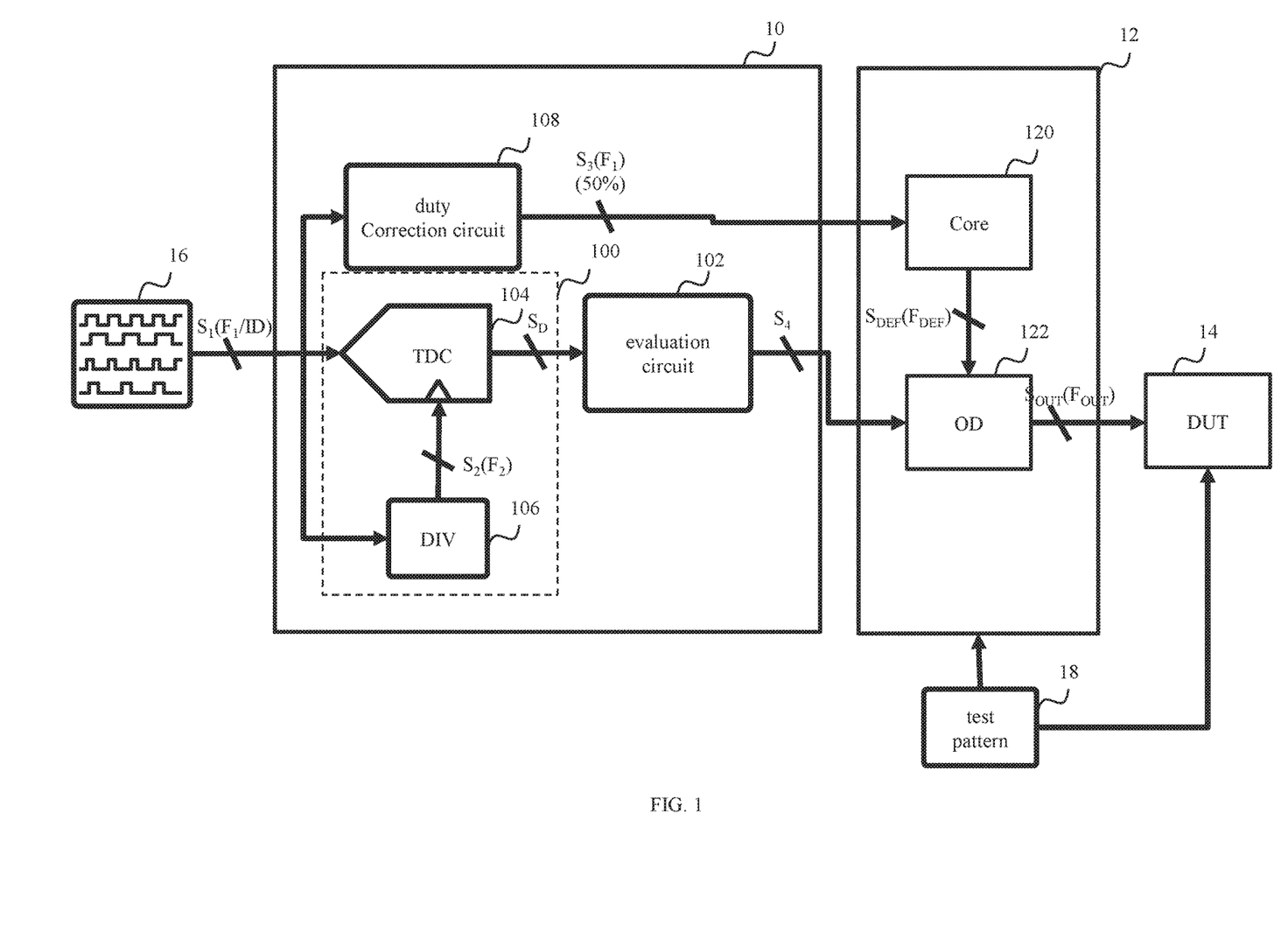
FIG. 1 is a block diagram of a circuit for controlling a phase locked loop (PLL) serving as a signal source of a device under test, in accordance with some embodiments of the present disclosure.

FIG. 1 is a block diagram of a circuit 10 for controlling a phase locked loop (PLL) 12 serving as a signal source of a device under test (DUT) 14, in accordance with some embodiments of the present disclosure. The embodiment shown in FIG. 1 illustrates an architecture for performing a SHMOO test. One type of SHMOO test verifies a function of the DUT 14 operating at different levels of an output frequency $F_{OUT}$ of an output signal $S_{OUT}$ from the PLL 12. To achieve such verification, a test equipment feeds a test pattern 18 into the PLL 12 and the DUT 14 so that the PLL 12 and the DUT 14 function in accordance with the test pattern 18, wherein the test pattern 18 includes a plurality of control signals for controlling the PLL 12 and the DUT 14. Moreover, the circuit 10 adjusts levels of the output frequency $F_{OUT}$, which will be described in detail below, so as to achieve the verification of the function of the DUT 14. In some embodiments, the DUT 14 includes a system on a chip (SoC), a central processing unit (CPU), a graphic processing unit (GPU), or other suitable circuits.

Referring to FIG. 1, the circuit 10 includes a digital converter 100, an evaluation circuit 102 and a duty correction circuit 108. The digital converter 100 functions to receive a first signal $S^1$, in a digital form, having a first frequency $F^1$ and an identification ID. Next, the digital converter 100 functions to perform a digital conversion of the first signal $S^1$ to generate a digital signal $S_D$, and to output the digital signal $S_D$ to the evaluation circuit 102, wherein the digital signal $S_D$ is associated with the identification ID of the first signal $S^1$.

A level of the first frequency $F_1$ is adjustable, as shown in the block 16. An adjustment of the level of the first frequency $F_1$ can be achieved by a test equipment, such as 93000. In some embodiments, the first frequency $F_1$ refers to a crystal frequency. In some embodiments, the first frequency $F_1$ ranges from about 25 megahertz (MHz) to about 50 MHz. However, the present disclosure is not limited to these specific values.

In the present embodiment, the identification ID includes a duty cycle; however, the present disclosure is not limited to the duty cycle. It should be noted that in addition to levels of the first frequency $F_1$, the duty cycle is also adjustable for identification. For example, the duty cycle may be approximately 12.5%, 37.5%, 62.5%, or 87.5%. However, the present disclosure is not limited to these specific values. An adjustment of the duty cycle can be achieved by a test equipment, such as 93000.

Moreover, levels of the first frequency $F_1$ and the duty cycle can be adjusted and combined freely, depending on the required level of the output frequency $F_{OUT}$. For example, setting the first frequency $F_1$ at 25 MHz of and the duty cycle at 87.5% results in the output frequency $F_{OUT}$ of 2500 MHz. Alternatively, setting the first frequency $F_1$ at 25 MHz and the duty cycle at 62.5% results in the output frequency $F_{OUT}$ of 1250 MHz. Alternatively, setting the first frequency $F_1$ at 50 MHz and the duty cycle at 62.5% results in the first frequency $F_1$ of 2500 MHz.

The evaluation circuit 102, coupled to the digital converter 100 and the PLL 12 external to the circuit 10, functions to receive the digital signal $S_D$, provide an evaluated identification based on the identification ID of the first signal $S_1$, evaluate a parameter level based on the evaluated identification, and output a fourth signal $S_4$ indicating the parameter level to the PLL 12. It should be noted that the evaluated identification is ideally equal to the identification ID of the first signal $S_1$.

In some embodiments, the fourth signal $S_4$ is a digital signal consisting of a first voltage level and a second voltage level. In some embodiments, the first voltage level refers to a voltage level corresponding to a logic high, and the second voltage level refers to a voltage level corresponding to a logic low. In some embodiments, the evaluation circuit 102 is implemented with a combinational logic.

In some embodiments, where the identification ID is a duty cycle, a parameter level is generated by indexing a lookup table. An exemplary lookup table is shown in TABLE 1 below.

TABLE 1

| | Responsible range of duty cycle | parameter level |
|---|---|---|
| Band 1 | ≥75% | 0 |
| Band 2 | <75% & ≥50% | 1 |
| Band 3 | <50% & ≥25% | 2 |
| Band 4 | <25% | 3 |

In the present embodiment, four bands, i.e., Band 1, Band 2, Band 3 and Band 4, are defined. However, the present disclosure is not limited thereto. A quantity of bands can be adjusted, depending on the desired resolution. When a greater resolution is desired, the evaluated duty cycle is closer to the duty cycle of the first signal $S_1$.

In addition, in the present embodiment, responsible ranges of duty cycles for all bands are equal, for example, 25%. However, the present disclosure is not limited thereto. In some embodiments, the responsible ranges of duty cycles for the bands may not be equal.

Moreover, it should be noted that an approach to determining critical points can be adjusted. For example, in the present embodiment, if an evaluated duty cycle is "equal to or greater than" 75%, then the evaluated duty cycle is classified as Band 1. In other embodiments, an evaluated duty cycle is classified as Band 1 only if the evaluated duty cycle is "greater than" 75%.

Each of the bands corresponds to one parameter level. According to such correspondence, the evaluation circuit 102 evaluates a parameter level based on an evaluated duty cycle. For example, if an evaluated duty cycle is 87.5%, since 87.5% is greater than 75%, the evaluated duty cycle is classified as Band 1. Accordingly, a parameter level is evaluated as 0. Alternatively, if an evaluated duty cycle is 62.5%, since 62.5% is greater than 50% and less than 75%, the evaluated duty cycle is classified as Band 2. Accordingly, a parameter level is evaluated as 1, and so on.

The duty correction circuit 108 functions to receive the first signal $S_1$, and next converts the first signal $S_1$ into a third signal $S_3$ by correcting a duty cycle of the first signal $S_1$, and then outputs the third signal $S_3$ to the PLL 12, wherein the third signal $S_3$ has the first frequency $F_1$. It should be noted that the duty correction circuit 108 is optional. In a case where the core 120 functions based on a positive edge trigger of a signal, the duty correction circuit 108 can be omitted. In a case where the core 120 functions based on a negative edge trigger of a signal, the duty correction circuit 108 is required, since different duty cycles lead to the negative edge occurring at different timings, which may result in the core 120 functioning abnormally.

The PLL 12 functions to receive the third signal $S_3$, to receive the fourth signal $S_4$, and to generate the output signal $S_{OUT}$ based on the third signal $S_3$ and the fourth signal $S_4$, based on a parameter level indicated by the fourth signal $S_4$. In further detail, the PLL 12 includes a core 120 and an output divider (OD) 122.

The core 120 functions to generate a default signal $S_{DEF}$ having a default frequency $F_{DEF}$ by multiplying the first frequency $F_1$ by a default multiple number, such as 100. A relationship between the default frequency $F_{DEF}$ and the first frequency $F_1$ can be expressed in equation (1):

$$F_{DEF} = F_1 \times DMN \tag{1}$$

Where DMN represents the default multiple number, the default multiple number being a positive integer.

The OD 122 functions to receive the default signal $S_{DEF}$, to receive the fourth signal $S_4$, and to generate the output signal $S_{OUT}$ by dividing the default frequency $F_{DEF}$ of the default signal $S_{DEF}$ by a parameter level. A relationship between the output frequency $F_{OUT}$ and the default frequency $F_{DEF}$ can be expressed in equation (2):

$$F_{OUT} = F_{DEF} \times \left(\frac{1}{2^{PA}}\right) \tag{2}$$

Where PA represents a parameter

Based on information shown in Table 1, given that the first frequency $F_1$ ranges from about 25 MHZ to about 50 MHZ and the default multiple number is 100, and based on equations (1) and (2), the output frequency $F_{OUT}$ can be obtained and summarized in the following TABLE 2.

TABLE 2

| | Duty cycle | parameter level | $F_1$ | $F_{OUT}$ |
|---|---|---|---|---|
| Band 1 | ≥75% | 0 | 35 | 3500 |
| | | | 25 | 2500 |
| Band 2 | <75% & ≥50% | 1 | 50 | 2500 |
| | | | 25 | 1250 |
| Band 3 | <50% & ≥25% | 2 | 50 | 1250 |
| | | | 25 | 625 |
| Band 4 | <25% | 3 | 50 | 625 |
| | | | 25 | 312.5 |

Verification of a function of the DUT 14 operating at the output frequency $F_{OUT}$ ranging from about 312.5 MHz to about 3500 MHz can be achieved based on different duty cycles of the first signal $S_1$ and function of the evaluation circuit 102. There is no need to prepare a test pattern to obtain a parameter level of 0, then prepare another test pattern to obtain a parameter level of 1, etc. Further, there is no need to prepare a multitude of test patterns merely for changing a parameter level. Time and effort to prepare such patterns is therefore conserved. Often, significant time has already been invested in the preparation of a single test pattern, and by eliminating the need to prepare a plurality of test patterns, the method of the present disclosure improves time efficiency.

The digital converter 100 includes a time-to-digital converter (TDC) 104 and a frequency divider (DIV) 106. The TDC 104 functions to receive the first signal $S_1$ and a second signal $S_2$ from the DIV 106, and outputs the digital signal $S_D$ associated with the identification ID based on the first signal $S_1$ and the second signal $S_2$. In further detail, the digital signal $S_D$ is generated by sampling the first signal $S_1$ by means of the second signal $S_2$. That is, the digital signal $S_D$ is generated based on the second signal $S_2$ from the DIV 106.

The DIV 106 is coupled to the TDC 104 to provide the second signal $S_2$ having a second frequency $F_2$ to the TDC 104. In the present embodiment, the second signal $S_2$ is generated by dividing the first frequency $F_1$ of the first signal $S_1$ by a predetermined number. Therefore, the second frequency $F_2$ of the second signal $S_2$ is proportional to the first frequency $F_1$ of the first signal $S_1$. However, the present disclosure is not limited thereto. The second signal $S_2$ is able to be generated in other suitable manners.

Figure 2:
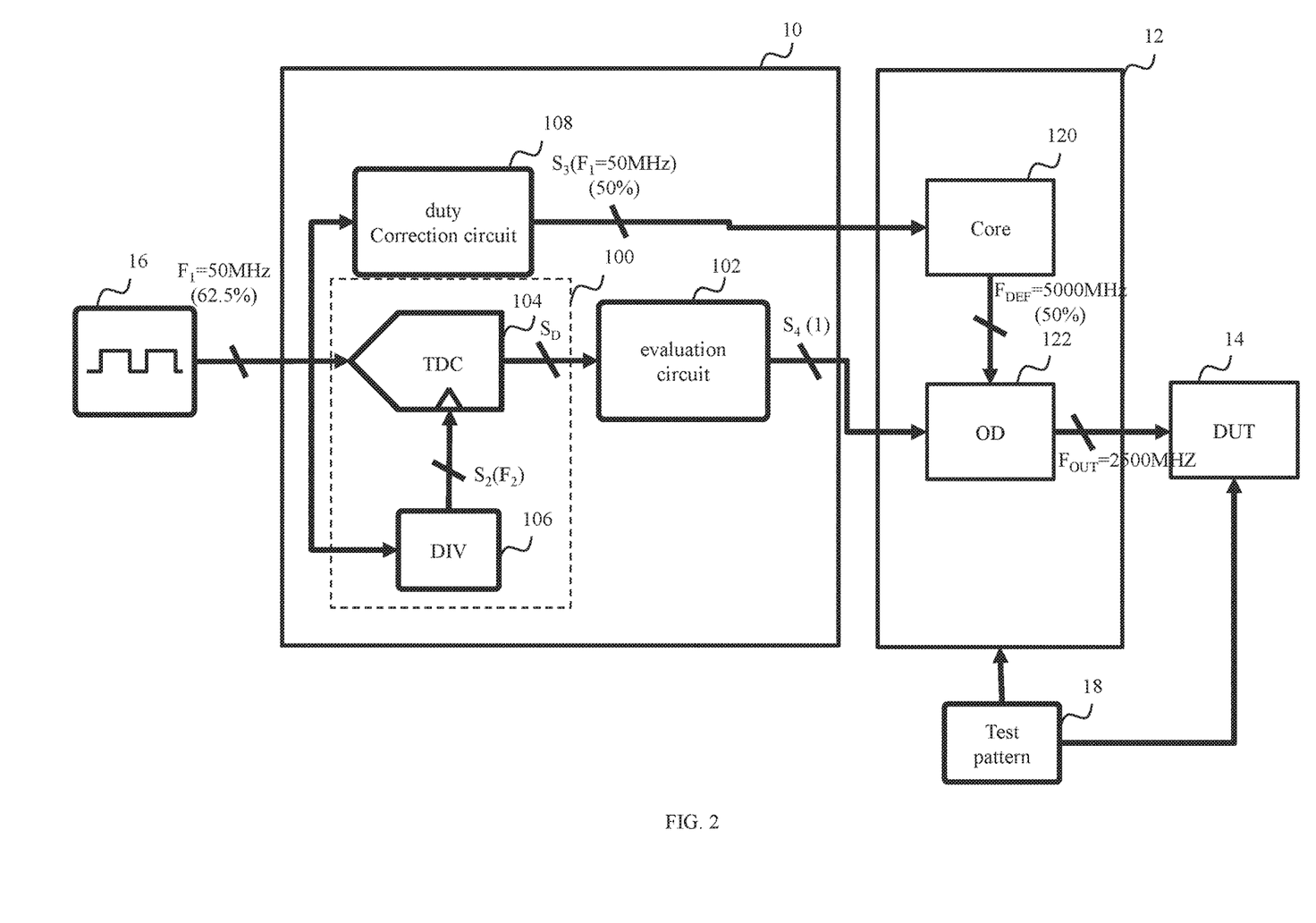
FIG. 2 is a block diagram illustrating an operation scenario of the circuit shown in FIG. 1, in accordance with some embodiments of the present disclosure.

FIG. 2 is a block diagram illustrating an operation scenario of the circuit 10 shown in FIG. 1, in accordance with some embodiments of the present disclosure. Referring to FIG. 2, a test equipment generates a first signal $S_1$ having a first frequency $F_1$ of 50 MHz and a duty cycle of 62.5%. The TDC 104 converts the first signal $S_1$ into the digital signal $S_D$. The evaluation circuit 102 determines that a parameter level is 1 by, for example, indexing the lookup table shown in TABLE 2 with the duty cycle of 62.5%.

The core 120 generates a default signal $S_{DEF}$ having a default frequency $F_{DEF}$ of 5000 MHz by multiplying the first frequency $F_1$ of 50 MHz by a default multiple number of 100, wherein the default signal $S_{DEF}$ has a duty cycle of 50%. The OD 122 generates an output signal $S_{OUT}$ having an output frequency $F_{OUT}$ of 2500 MHz based on a parameter level of 1 and the default frequency $F_{DEF}$ of 5000 MHz with reference to equation (2).

Figure 3:
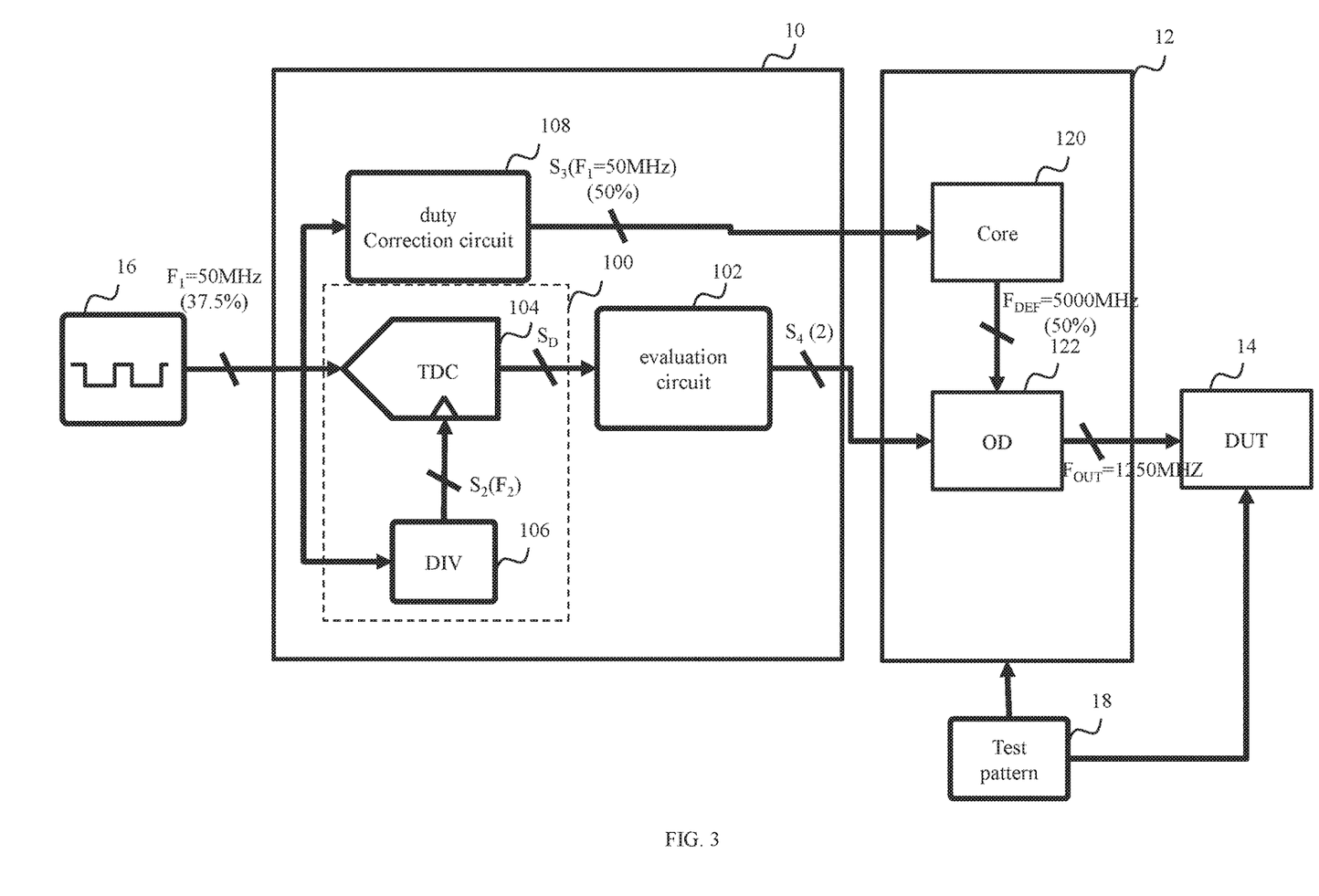
FIG. 3 is a block diagram illustrating another operation scenario of the circuit shown in FIG. 1, in accordance with some embodiments of the present disclosure.

FIG. 3 is a block diagram illustrating another operation scenario of the circuit 10 shown in FIG. 1, in accordance with some embodiments of the present disclosure. It should be noted that the operation shown in FIG. 3 follows the operation shown in FIG. 2, and since an operation procedure of the circuit 10 shown in FIG. 3 is the same as that shown in FIG. 2, repeated description of similar processes is omitted herein.

Referring to FIG. 3, a test equipment generates a first signal $S_1$ having a first frequency $F_1$ of 50 MHz and a duty cycle of 37.5%. The evaluation circuit 102 determines that a parameter level is 2 based on the duty cycle of 37.5%. The OD 122 generates an output signal $S_{OUT}$ having an output frequency $F_{OUT}$ of 1250 MHz based on a parameter level of 2 and the default frequency $F_{DEF}$ of 5000 MHz with reference to equation (2).

As observed from FIGS. 2 and 3, although the output frequency $F_{OUT}$ is changed from 2500 MHz to 1250 MHz, the test pattern 18 is kept the same. In further detail, the PLL 12 and the DUT 14 operate based on the same test pattern 18. As a result, the method of the present disclosure provides greater time efficiency.

Figure 4:
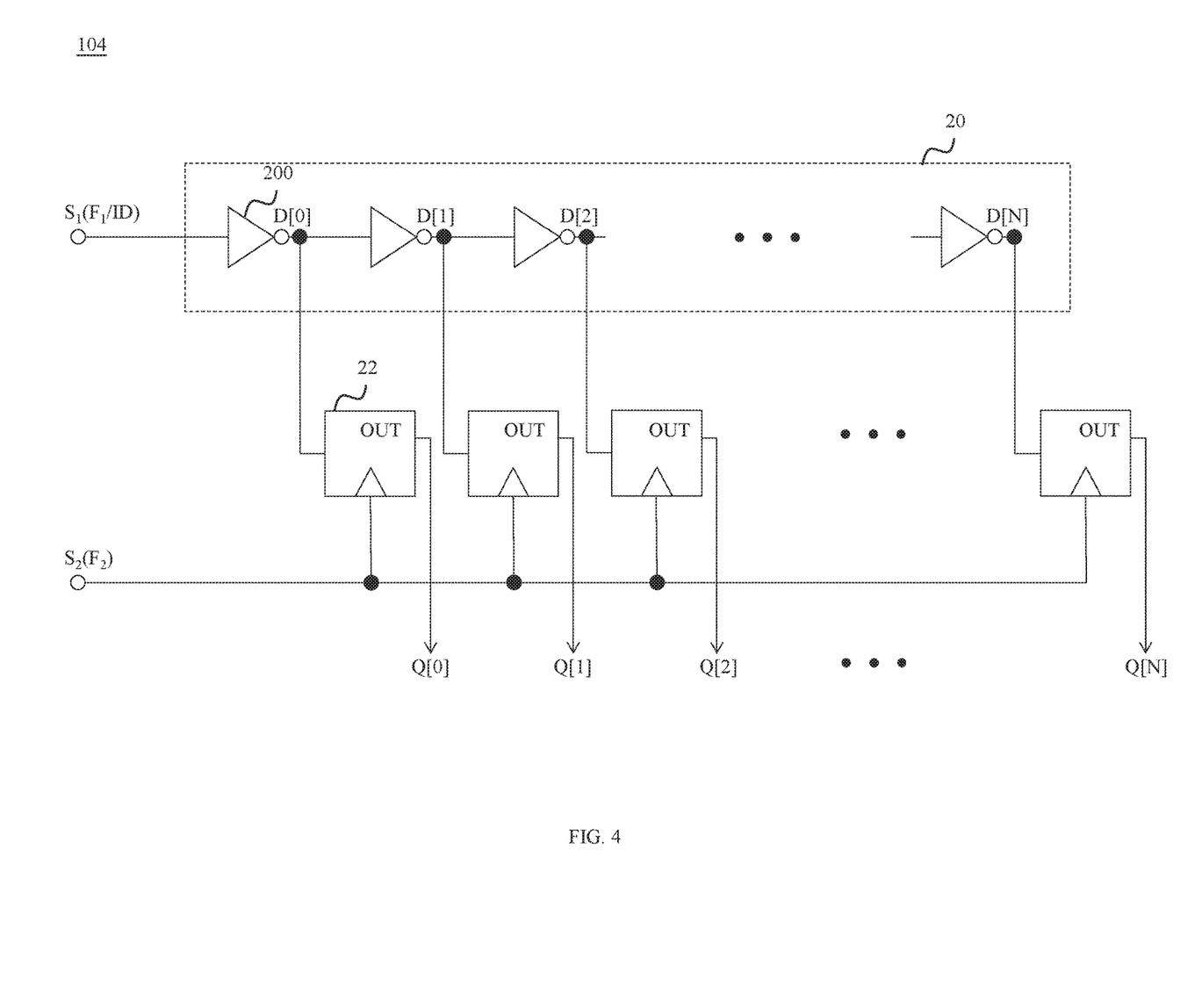
FIG. 4 is a circuit diagram of a time-to-digital converter (TDC) shown in FIG. 1, in accordance with some embodiments of the present disclosure.

FIG. 4 is a circuit diagram of the TDC 104 shown in FIG. 1, in accordance with some embodiments of the present disclosure. Referring to FIG. 4, the TDC 104 includes a delay chain 20 and a plurality of sampling circuits 22. The delay chain 20 includes a plurality of buffers 200. In the present embodiment, time delays provided by the buffers 200 are equal. For example, the time delay is 300 picoseconds (ps). The time delay and a quantity of the buffer 200 are adjustable, depending on the desired resolution. Each of the buffers 200 includes an input and an output. An output for the first buffer 200 in the delay chain 20 is denoted as D[0],
an output for the second buffer 200 in the delay chain 20 is denoted as D[1], and the last buffer 200 in the delay chain 20 is denoted as D[N], wherein N is a positive integer.

The sampling circuit 22 includes an input, an output, and a clock input. The input, the output, and the clock input of the sampling circuit 22 are coupled to the corresponding output of the buffer 200, the evaluation circuit 102, and to the DIV 106, respectively. As such, the sampling circuit 22 samples a signal at the corresponding output of the buffer 200 by means of the second signal $S_2$, and outputs a signal indicating the sampling result to the evaluation circuit 102. For distinguishing one from another, the signal output from the first sampling circuit 22 is denoted as Q[0], the signal output from the second sampling circuit 22 is denoted as Q[1], and the signal output from the last sampling circuit is demoted as Q[N]. In some embodiments, the sampling circuit 22 includes a flip-flop. In some embodiments, N is 4, and the digital signal $S_D$ consisting Q[0] to Q[4] can be indicated as 00000, 00001, 00010, and so on.

Figure 5:
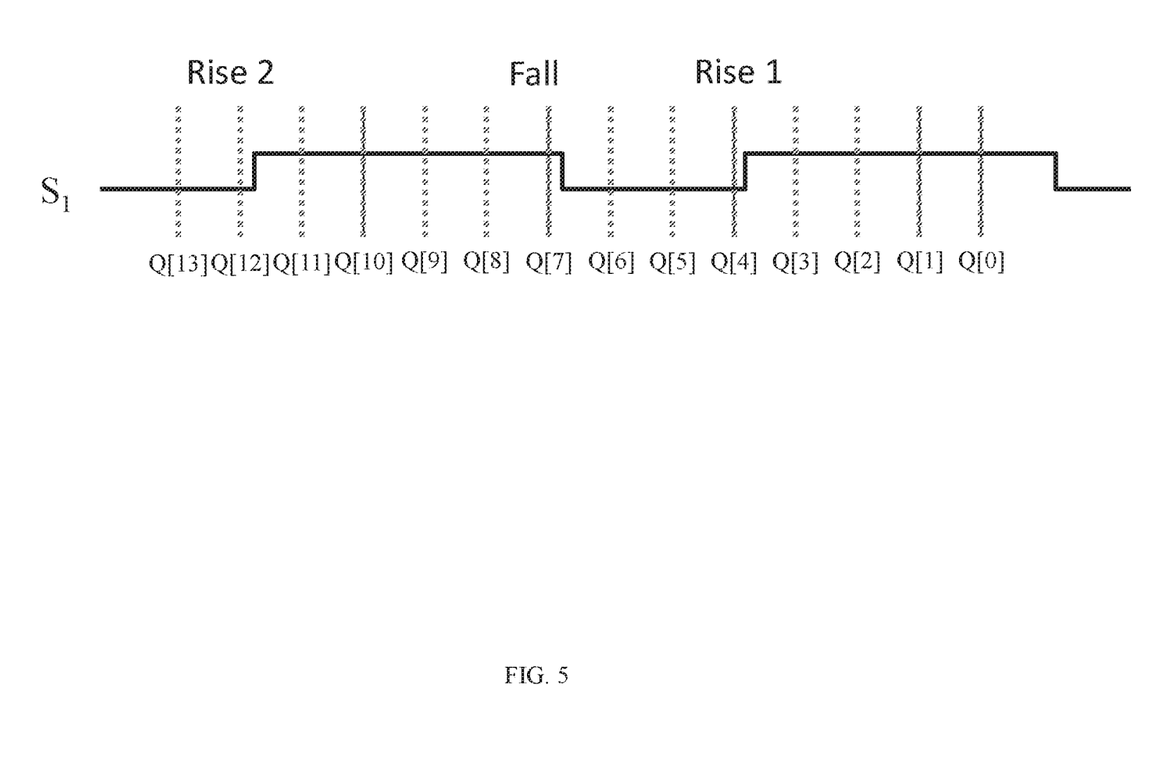
FIG. 5 is a wave diagram illustrating a sample operation, with respect to the operation scenario shown in FIG. 2, performed by the TDC shown in FIG. 4, in accordance with some embodiments of the present disclosure.

FIG. 5 is a wave diagram illustrating a sample operation, with respect to the operation scenario shown in FIG. 2, performed by the TDC 104 shown in FIG. 4, in accordance with some embodiments of the present disclosure. For convenience of discussion, it is assumed that a signal at the output D[0] of the buffer 200 is called a first delay signal; and a signal at the output D[1] of the buffer 200 is called a second delay signal.

The second delay signal is delayed from the first delay signal. Such circumstance is equivalent to a voltage level of the first delay signal and a voltage level of the second delay signal corresponding to voltage levels at two different sampling points on the same first signal $S_1$, as shown in FIG. 5.

Referring to FIG. 5, in the present embodiment, N is 13. The signals Q[0] to Q[13] are summarized in the following TABLE 3.

TABLE 3

| Q[13] | Q[12] | Q[11] | Q[10] | Q[9] | Q[8] | Q[7] | Q[6] | Q[5] | Q[4] | Q[3] | Q[2] | Q[1] | Q[0] |
|---|---|---|---|---|---|---|---|---|---|---|---|---|---|
| 0 | 0 | 1 | 1 | 1 | 1 | 1 | 0 | 0 | 0 | 1 | 1 | 1 | 1 |

The TDC 104 outputs the digital signal $S_D$ including a binary code "00111110001111" to the evaluation circuit 102. The evaluation circuit 102 according to the binary code determines a rising edge and a falling edge of the digital signal $S_D$. For example, the evaluation circuit 102 determines that a first edge is a first rising edge Rise 1 occurring at a sampling point associated with the signal Q[4]; a second edge is a falling edge Fall occurring at a sampling point associated with the signal Q[7]; and a third edge is a second rising edge Rise 2 occurring at a sampling point associated with the signal Q[12]. Subsequently, the evaluation circuit 102 determines a parameter level based on an order of the first rising edge Rise 1, the second rising edge Rise 2 and the falling edge Fall in a rank of the digital signal $S_D$.

In further detail, the evaluation circuit 102 determines a sampling point corresponding to the first rising edge Rise 1 is prior to a sampling point corresponding to the falling edge Fall in the rank of the digital signal $S_D$. Next, the evaluation circuit 102 determines an inactive time of a period according to the following equation (3):

$$TN = S[F] - S[R] \qquad (3)$$

Where TN represents the inactive time of a period; S[F] represents the sampling point of a falling edge; and, S[R] represents the sampling point of a rising edge.

In the present embodiment, according to the signals Q[4] and Q[7], the sampling point of the first rising edge Rise 1 is 4, and the sampling point of the falling edge Fall is 7. Therefore, the inactive time of a period is 3 based on the equation (3).

Moreover, the evaluation circuit 102 determines an active time of a period according to the following equation (4):

$$TA=S[R]-S[F] \quad (4)$$

Where TA represents the active time of a period.

In the present embodiment, according to the signals Q[12] and Q[7], the sampling point of the second rising edge Rise 2 is 12, and the sampling point of the falling edge Fall is 7. Therefore, the active time of a period is 5 based on the equation (4).

The evaluation circuit 102 determines a period according to the following equation (5):

$$TP=S[R2]-S[R1] \quad (5)$$

Where TP represents the period; S[F2] represents a sampling point of a second rising edge; and S[F1] represents a sampling point of a first rising edge.

In the present embodiment, according to the signals Q[12] and Q[4], the sampling point of the first rising edge Rise 1 is 4, and the sampling point of the second rising edge Rise 2 is 12. Therefore, the period is 8 based on the equation (5).

Alternatively, the evaluation circuit 102 determines a period according to the following equation (6):

$$TP=S[F2]-S[F1] \quad (6)$$

Where TP represents the period; S[F2] represents a sampling point of a second falling edge; and S[F1] represents a sampling point of a first falling edge.

With information on the active time, inactive time and the period, the evaluation circuit 102 is able to determine an evaluated duty cycle. In the present embodiment, the evaluated duty cycle is 62.5%, which is equal to the duty cycle of the first signal $S_1$ generated by a test equipment.

Figure 6:
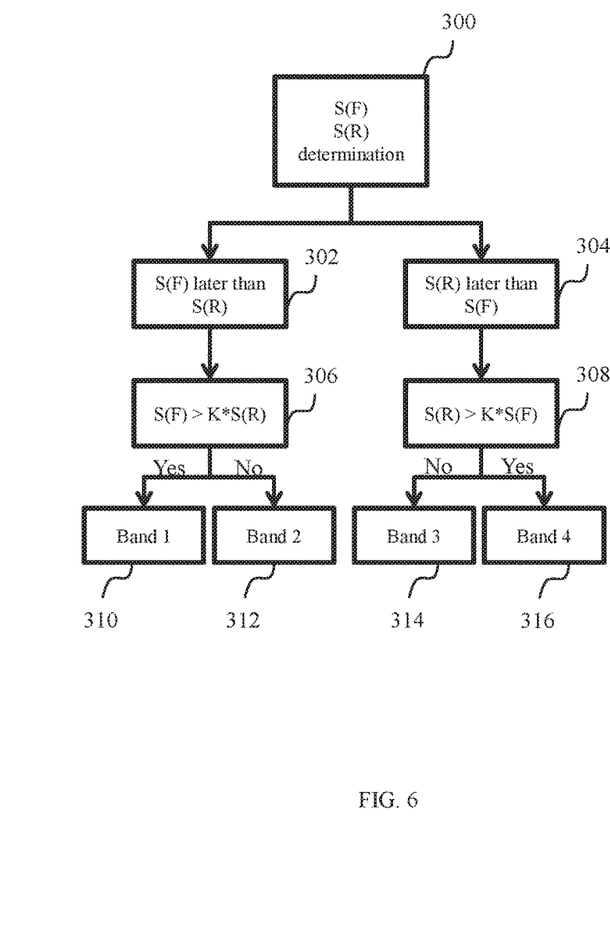
FIG. 6 is a flowchart of a method of determining a duty cycle, in accordance with some embodiments of the present disclosure.

Alternatively, the evaluation circuit 102 determines an evaluated duty cycle based on an algorithm as shown in FIG. 6. It should be noted that the evaluation circuit 102 is based on combinational logic implemented to perform the algorithm shown in FIG. 6.

FIG. 6 is a flowchart of a method 30 of evaluating a duty cycle, in accordance with some embodiments of the present disclosure. Referring to FIG. 6, the method 30 includes operations 300, 302, 304, 306, 308, 310, 312, 314 and 316.

In operation 300, the sampling points S[F] and S[R] are determined in accordance with approaches described in the embodiment of FIG. 5.

If the sampling point S[F] is later than the sampling point S[R], the method 30 proceeds to operation 302. Alternatively, if the sampling point S[R] is later than the sampling point S[F], the method 30 proceeds to operation 304. In the embodiment of FIG. 5, since the sampling point S[F] of 7 is later than the sampling point S[R] of 4, the method 30 proceeds to operation 302.

Following operation 302, in operation 306, it is determined whether the sampling point S[F] is greater than a product of K and the sampling point S[R], wherein K is a positive integer. In the present embodiment, K is given as 3. If affirmative, the method 30 proceeds to operation 310. In operation 310, an evaluated duty cycle is classified as Band 1. If negative, the method 30 proceeds to operation 312. In operation 312, an evaluated duty cycle is classified as Band 2. In the embodiment of FIG. 5, it is negative, and therefore the evaluated duty cycle is classified as Band 2.

Following operation 304, in operation 308, it is determined whether the sampling point S[R] is greater than a product of K and the sampling point S[F]. If affirmative, the method 30 proceeds to operation 316. In operation 316, an evaluated duty cycle is classified as Band 4. If negative, the method 30 proceeds to operation 314. In operation 314, an evaluated duty cycle is classified as Band 3.

Figure 7:
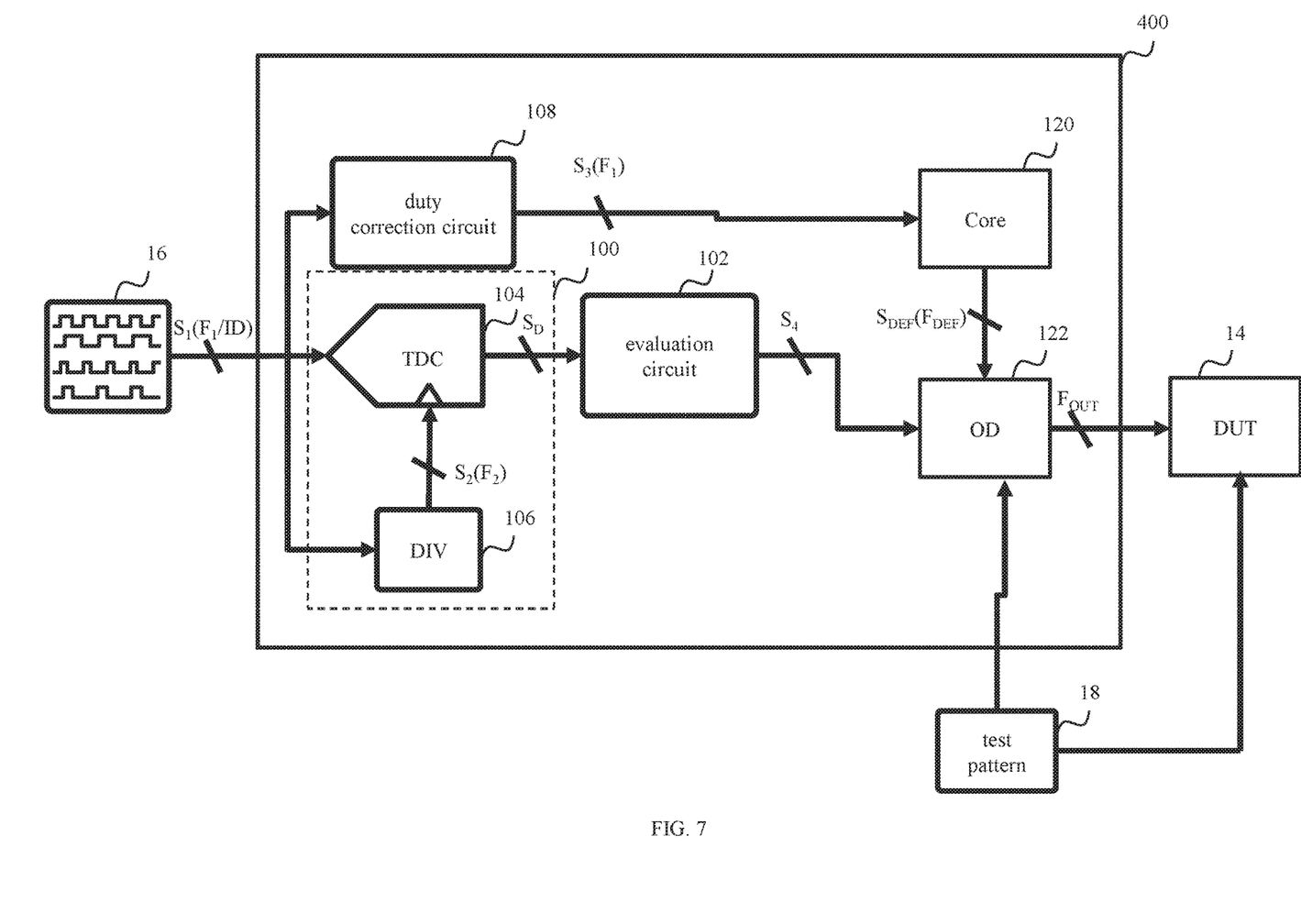
FIG. 7 is a block diagram of a PLL serving as a signal source of a device under test, in accordance with some embodiments of the present disclosure.

FIG. 7 is a block diagram of a PLL 400 serving as a signal source of a DUT 14, in accordance with some embodiments of the present disclosure. Referring to FIG. 4, the PLL 400 is similar to the circuit 10 and the PLL 12 shown in FIG. 1 except that, for example, the TDC 104, the DIV 106, the duty correction circuit 108, the evaluation circuit 102, the core 120 and the OD 122 are integrated into a single chip, resulting in the PLL 400. It should be noted that, although the test pattern 18 is depicted as being coupled to the OD 122, such depiction does not represent that a parameter level is controlled by the test pattern 18; rather, such depiction is used to illustrate that the test pattern 18 is used to control an operation of the OD 122 other than adjustment of a parameter level.

Figure 8:
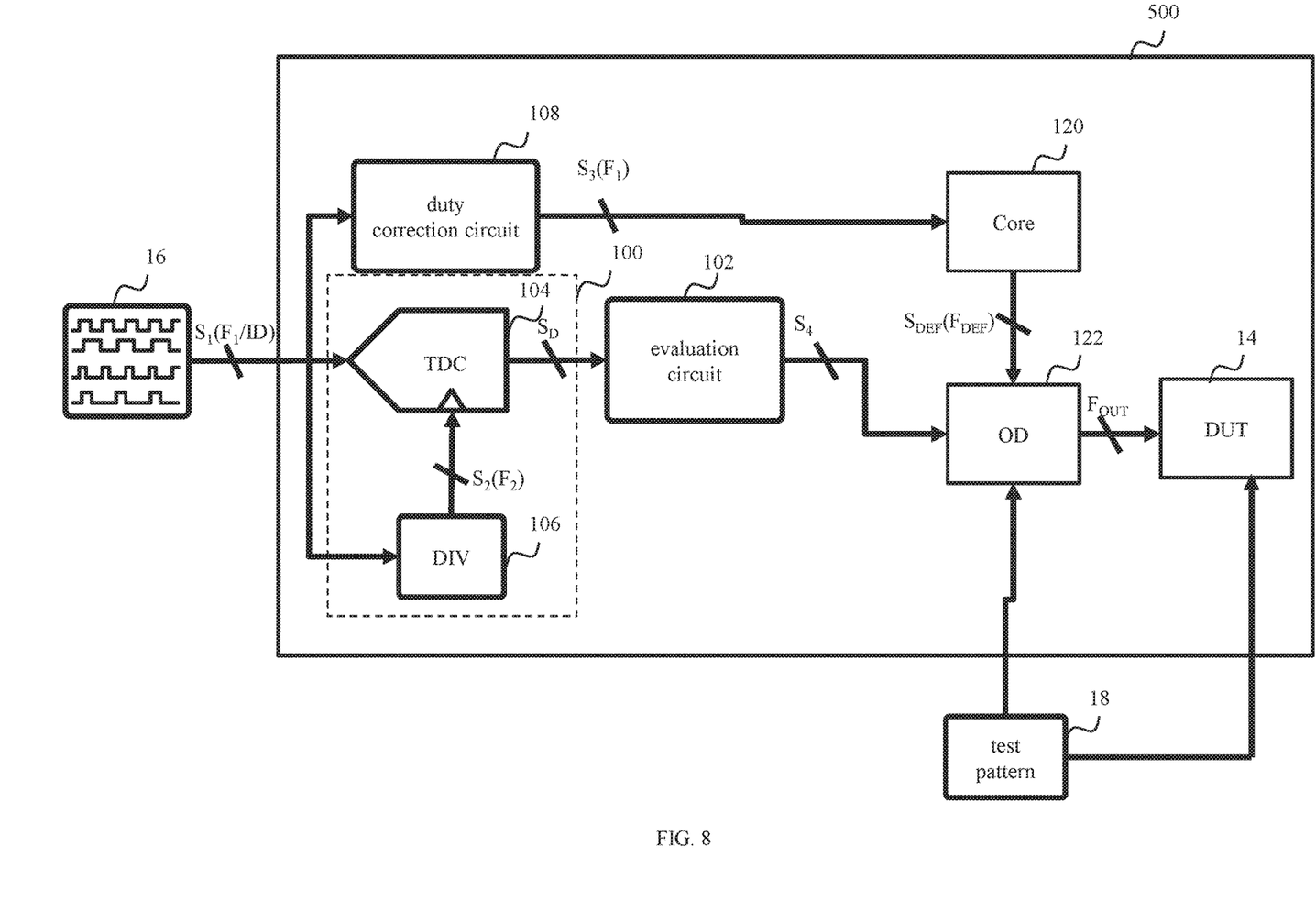
FIG. 8 is a block diagram of a semiconductor device, in accordance with some embodiments of the present disclosure.

FIG. 8 is a block diagram of a semiconductor device 500, in accordance with some embodiments of the present disclosure. Referring to FIG. 8, the semiconductor device 500 is similar to the PLL 400 shown in FIG. 7 except that, for example, the PLL 400 and the DUT 14 are integrated into a single semiconductor device, resulting in the semiconductor device 500.

Figure 9:
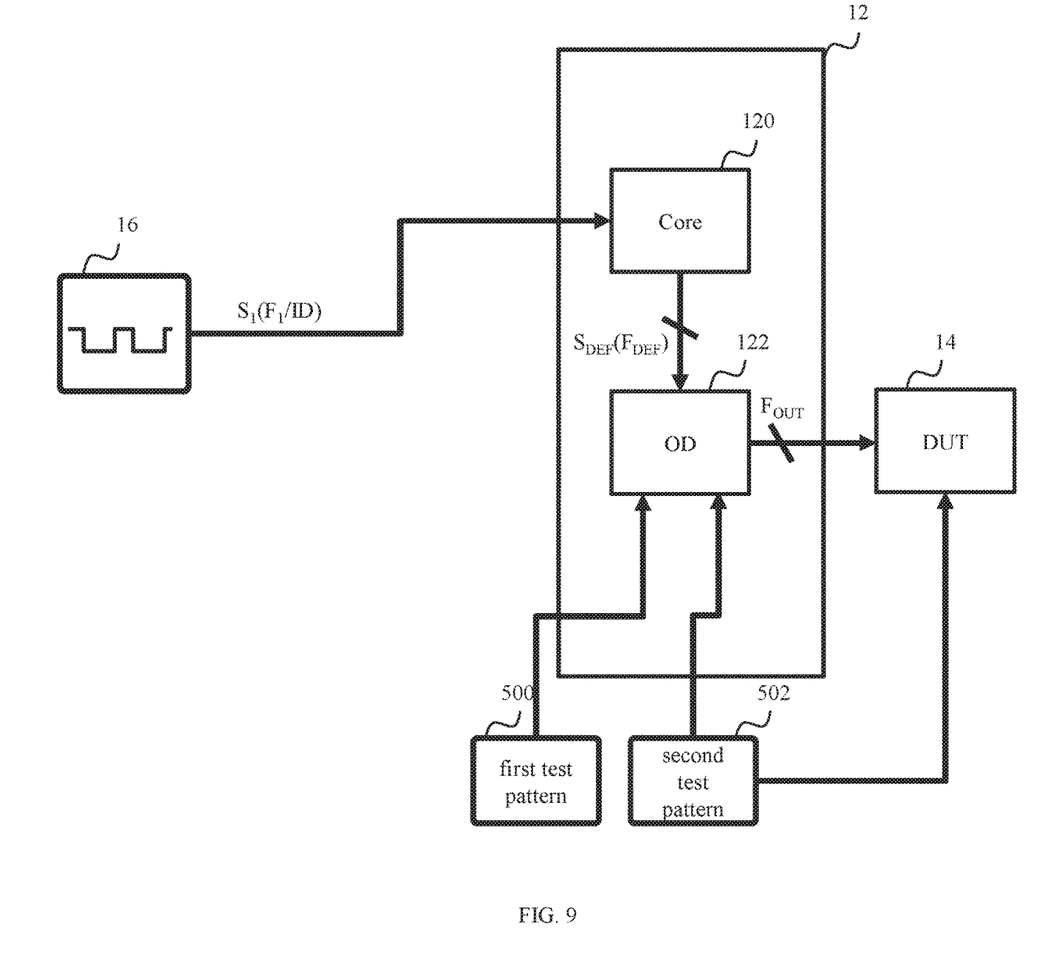
FIG. 9 is a block diagram of a PLL, in accordance with a comparative embodiment of the present disclosure.

FIG. 9 is a block diagram of a PLL 12, in accordance with a comparative embodiment of the present disclosure. In this comparative embodiment, a parameter level is controlled by a test pattern, i.e., a first pattern 500 and a second test pattern 502 shown in FIG. 9. That is, when a test pattern is changed, a parameter level may be changed. The first pattern 500 and the second pattern 502 may indicate different parameter levels.

Referring to FIG. 9, as mentioned above, if it is desired to perform a SHMOO test on the DUT 14 operating with an output signal $S_{OUT}$ from the PLL 12 having output frequencies $F_{OUT}$ of 1250 MHz and 2500 MHz, then it is required to prepare the first pattern 500 which indicates a parameter level of 0, such that the PLL 12 outputs the output frequency $F_{OUT}$ of 2500 MHz. Next, the DUT 14 operates at 2500 MHz of the output frequency $F_{OUT}$ of the output signal $S_{OUT}$ to verify a function of the DUT 14 operating at 2500 MHz. After a SHMOO test at 2500 MHz is completed, the first test pattern 500 is changed to the second test pattern 502. The PLL 12 then outputs the output frequency $F_{OUT}$ of 1250 MHz based on the second test pattern 502. Subsequently, the DUT 14 operates at 1250 MHz of the output frequency $F_{OUT}$ of the output signal $S_{OUT}$ to verify a function of the DUT 14 operating at 1250 MHz. Thus, when it is required to prepare at least two test patterns, the comparative method provides poor time efficiency.

Figure 10:
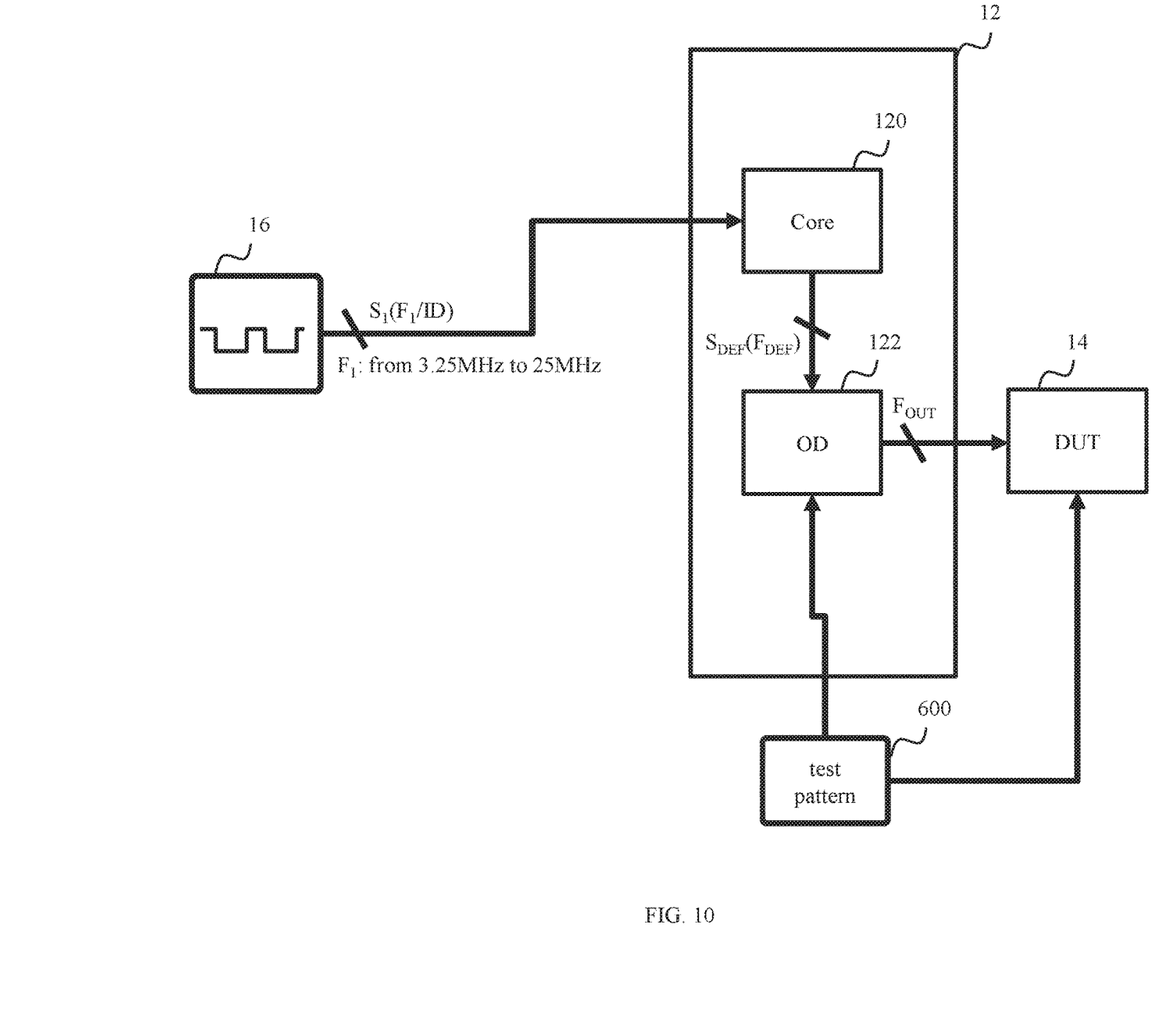
FIG. 10 is a block diagram of a PLL, in accordance with another comparative embodiment of the present disclosure.

FIG. 10 is a block diagram of a PLL 12, in accordance with another comparative embodiment of the present disclosure. Referring to FIG. 10, in this comparative embodiment, a test pattern 600 is associated with a parameter level is 0. The test pattern 600 is kept unchanged during a SHMOO test, and therefore a parameter level is kept unchanged, such as 0, during a SHMOO test. It is given that a default multiple number is 100 and a parameter level is 0. In addition, a spec of the PLL 12 provides that the PLL 12 works normally at the first frequency $F_1$ ranging from about 25 MHZ to about 50 MHz.

It is assumed that it is desired to verify a function of the DUT 14 operating with an output signal $S_{OUT}$ having output frequencies $F_{OUT}$ ranging from 325 MHz to 2500 MHz. First, a test equipment provides the first signal $S_1$ having the first frequency $F_1$ of 3.25 MHz to the PLL 12. Accordingly, the PLL 12 provides the output frequency $F_{OUT}$ of 325 MHz to the DUT 14 for a SHMOO test.

After the SHMOO test at 325 MHz is completed, a test equipment provides the first signal $S_1$ having the first frequency $F_1$ of 25 MHz to the PLL 12. The test pattern 600 is kept unchanged so that a parameter level is kept at 0 when the first frequency $F_1$ is changed from 3.25 MHz to 25 MHz. It should be noticed that the first frequency $F_1$ of 25 MHz is out of a frequency range, i.e., 2.5 MHz to 3.5 MHz, of the PLL 12 provided in the spec. A circuit designer does not guarantee that the PLL 12 still functions normally when the PLL 12 operates at the first frequency $F_1$ of 25 MHz. That is, the PLL 12 may provide the output signal $S_{OUT}$ with an incorrect and unexpected output frequency $F_{OUT}$ to the DUT 14. As a result, a test result provided from the DUT 14 is possibly inaccurate and therefore is not reliable.

In some embodiments, the present disclosure provides a circuit. The circuit includes a time-to-digital converter (TDC), and an evaluation circuit coupled to the TDC and a phase-locked loop (PLL) external to the circuit.

In some embodiments, the present disclosure also provides a phase-locked loop (PLL). The PLL includes a time-to-digital converter (TDC), an evaluation circuit coupled to the TDC, and an output divider coupled to the evaluation circuit and a device under test (DUT) external to the PLL.

In some embodiments, the present disclosure also provides a semiconductor device. The semiconductor device includes a time-to-digital converter (TDC), an evaluation circuit coupled to the TDC, an output divider coupled to the evaluation circuit, and a device under test (DUT) coupled to the output divider.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising: a time-to-digital converter (TDC), configured to receive a first signal having an identification and a first frequency, and output a digital signal associated with the identification of the first signal; and an evaluation circuit, coupled to the TDC and a phase-locked loop (PLL) external to the circuit, wherein the evaluation circuit is configured to receive the digital signal, and output a signal indicating a parameter associated with the digital signal to the PLL.

2. The circuit of claim 1, wherein the identification comprises a duty cycle.

3. The circuit of claim 2, wherein a level of the parameter corresponds to a range within which the duty cycle falls.

4. The circuit of claim 1, further comprising: a frequency divider coupled to the TDC to provide a second signal having a second frequency to the TDC.

5. The circuit of claim 4, wherein the digital signal is generated based on the second signal from the frequency divider.

6. The circuit of claim 4, wherein the digital signal is generated by sampling the first signal by means of the second signal.

7. The circuit of claim 1, wherein the TDC comprises:
a first buffer having a first input and a first output;
a second buffer having a second input coupled to the first output of the first buffer, and a second output;
a first sampling circuit having a first input coupled to the first output of the first buffer, a second input, and a first output; and
a second sampling circuit having a third input coupled to the second output of the second buffer, a fourth input coupled to the second input of the first sampling circuit, and a second output.

8. The circuit of claim 7, wherein the first input of the first buffer is configured to receive the first signal having the identification and the first frequency.

9. The circuit of claim 8, further comprising a frequency divider, wherein the second input of the first sampling circuit is coupled to the frequency divider to receive a second signal having a second frequency.

10. The circuit of claim 9, wherein the first output of the first sampling circuit provides a first voltage level in accordance with the first signal and the second signal.

11. The circuit of claim 10, wherein the second output of the second sampling circuit provides a second voltage level in accordance with a signal received from the second output of the second buffer and the second signal.

12. The circuit of claim 11, wherein the TDC outputs the first voltage level and the second voltage level to the evaluation circuit.

13. The circuit of claim 2, wherein the evaluation circuit is configured to evaluate the duty cycle by determining a rising edge and a falling edge of the digital signal.

14. The circuit of claim 1, wherein the evaluation circuit is configured to evaluate the identification, based on the digital signal, to provide an evaluated identification.

15. The circuit of claim 14, wherein the evaluation circuit is configured to determine the parameter based on the evaluated identification.

16. The circuit of claim 15, wherein the identification is evaluated based on a transition between a first voltage level and a second voltage level of the digital signal.

17. A phase-locked loop (PLL), comprising:
a time-to-digital converter (TDC);
an evaluation circuit coupled to the TDC; and
an output divider (OD), coupled to the evaluation circuit and a device under test (DUT) external to the PLL;
wherein the TDC is configured to receive a first signal having an identification and a first frequency, and output a digital signal associated with the identification of the first signal to the evaluation circuit; the identification comprises a duty cycle.

18. The PLL of claim 17, wherein the evaluation circuit is configured to receive a predetermined quantity of voltage levels in a period of time.

19. A semiconductor device, comprising:
a time-to-digital converter (TDC), configured to receive a first signal having a first frequency and an identification;
an evaluation circuit coupled to the TDC;
an output divider (OD) coupled to the evaluation circuit; and
a device under test (DUT) coupled to the output divider;

wherein the OD is configured to output a second signal having a second frequency associated with the identification to the DUT.

20. The PLL of claim 17, wherein a test pattern is coupled to the OD to control operation the OD; when the second frequency is changed from a first frequency level to a second frequency level different from the first frequency level, the test pattern is kept the same.

* * * * *